United States Patent
Taki

(10) Patent No.: US 7,635,998 B1
(45) Date of Patent: Dec. 22, 2009

(54) PRE-DRIVER FOR BRIDGE CIRCUIT

(75) Inventor: Konosuke Taki, Sendai (JP)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/170,451

(22) Filed: Jul. 10, 2008

(51) Int. Cl.
*H03K 3/01* (2006.01)

(52) U.S. Cl. .................... 327/108; 327/112; 327/587

(58) Field of Classification Search ............ 326/27, 326/30, 87; 327/108, 112, 587, 427, 423, 327/306
See application file for complete search history.

(56) References Cited

U.S. PATENT DOCUMENTS

| | | | |
|---|---|---|---|
| 4,140,977 A | 2/1979 | Ahmed | |
| 4,404,528 A | 9/1983 | Yamaguchi | |
| 4,818,901 A | 4/1989 | Young | |
| 5,367,210 A | 11/1994 | Lipp | |
| 5,546,029 A | 8/1996 | Koke | |
| 5,736,973 A | 4/1998 | Godfrey et al. | |
| 5,990,640 A | 11/1999 | Dwyer et al. | |
| 5,994,942 A | 11/1999 | Itoh | |
| 6,037,842 A | 3/2000 | Bryan | |
| 6,091,276 A | 7/2000 | Aiello | |
| 6,130,549 A | 10/2000 | Buck | |
| 6,538,464 B2 * | 3/2003 | Muljono et al. | 326/27 |
| 6,900,657 B2 | 5/2005 | Bui et al. | |
| 6,919,870 B2 | 7/2005 | Fukuda | |
| 7,005,903 B2 * | 2/2006 | Chan et al. | 327/170 |
| 7,034,627 B1 | 4/2006 | Kudari | |
| 7,068,450 B2 | 6/2006 | Ngo | |
| 7,239,182 B2 | 7/2007 | Fukazawa | |

FOREIGN PATENT DOCUMENTS

| | | |
|---|---|---|
| JP | 2000082946 A | 3/2000 |
| JP | 2005354586 A | 12/2005 |

OTHER PUBLICATIONS

MC33883 H-Bridge Gate Driver, Analog Products Fact Sheet, Freescale Semiconductor, Inc., 2007.
MPC17259 0.7 A Dual H-Bridge Motor Driver with 3.0v/5.0v Compatible Logic I/O, Freescale Semiconductor Inc., 2005.

* cited by examiner

*Primary Examiner*—Dinh T. Le
(74) *Attorney, Agent, or Firm*—Charles Bergere

(57) ABSTRACT

A pre-driver for driving a high-side transistor of a bridge driver is connected to a bridge driver including first and second drive transistors connected in series between a high voltage power supply and ground. A reference circuit generates a reference voltage that varies depending on the output voltage of the bridge driver. In response to the reference voltage, the regulator circuit generates an internal power supply voltage that is substantially higher than the output voltage by a constant value. A buffer circuit generates a drive voltage for driving the first drive transistor based on the internal power supply voltage and the output voltage.

16 Claims, 2 Drawing Sheets

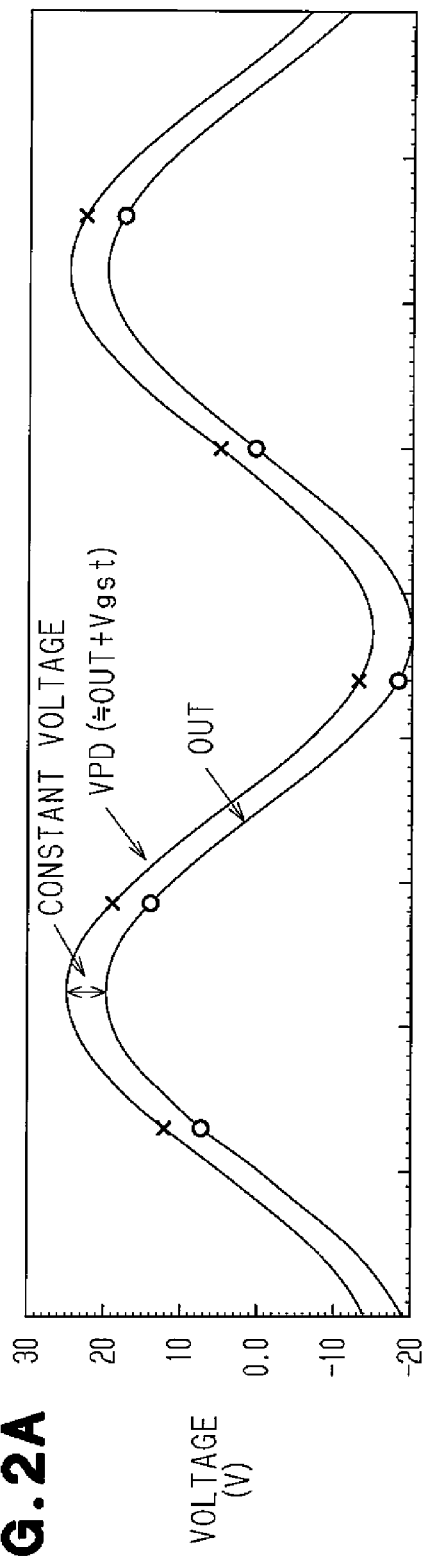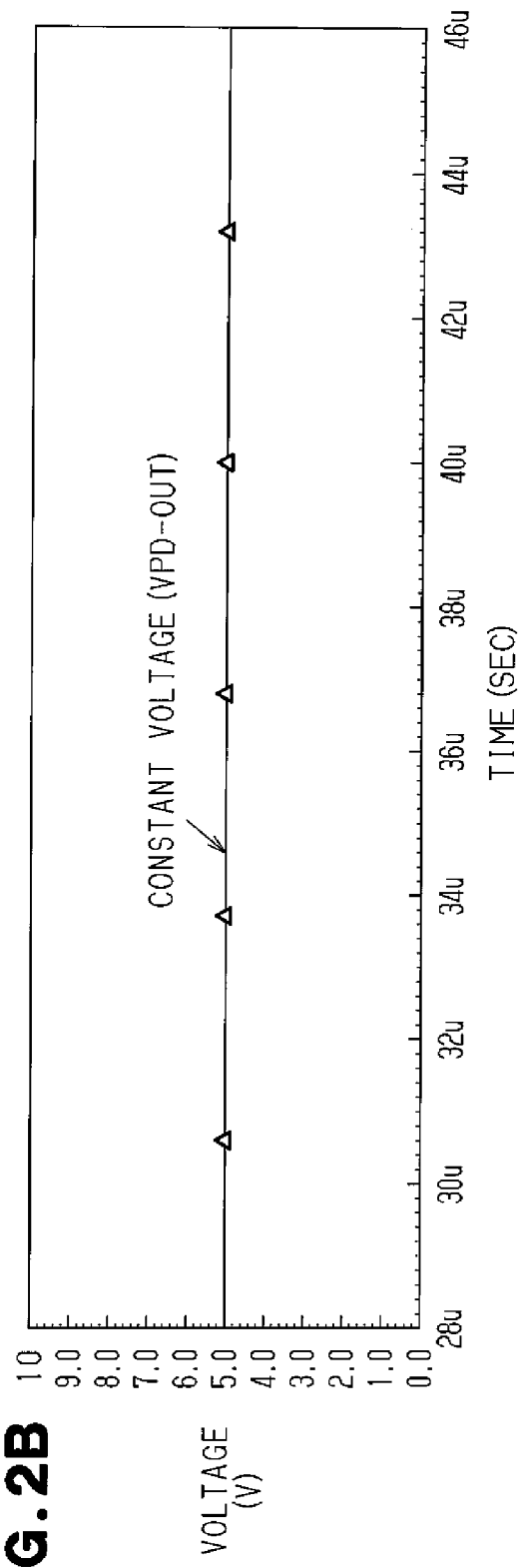

PRE-DRIVER FOR BRIDGE CIRCUIT

BACKGROUND OF THE INVENTION

The present invention relates to a pre-driver, and more particularly, to a pre-driver for connecting a load such as a motor to a drive circuit.

A bridge driver is known in the art as a drive circuit for driving a motor. A half-bridge circuit, which is formed by two NMOS transistors, or a full-bridge circuit (also known as "H-bridge"), which is formed by four NMOS transistors, normally make up the bridge driver. In a half-bridge circuit, two transistors are connected in series between a high potential power supply and ground. Output voltage generated at an output node between the two transistors is supplied as an operational voltage to a load. In a full-bridge circuit, a first set of two series-connected transistors and a second set of two series-connected transistors are connected in parallel between a high potential power supply and ground. A first output voltage, which is generated at a node between the first set of transistors, and a second output voltage, which is generated at a node between the second set of transistors, are supplied to a load. A pre-driver is used as a gate drive circuit that drives the transistors of a bridge driver such as a half bridge circuit or a full bridge circuit.

Japanese Laid-Open Patent Publication No. 2005-354586 describes a pre-driver that drives a high-side transistor (MOS transistor connected to high power supply) arranged in a bridge driver. The pre-driver charges a gate capacitor formed between the source and gate of the high-side transistor with constant current. This prevents the gate drive voltage supplied to the high-side transistor from exceeding the source-gate withstand voltage (gate voltage) of the high-side voltage.

However, in the pre-driver described in the above publication, the rise speed of the gate drive voltage is restricted to be less than or equal to a constant speed to prevent the gate drive voltage from exceeding the gate voltage. This speed restriction effects the responsiveness of the circuit. The responsiveness may be improved by increasing the speed (current amount) used to charge the gate capacitor. However, increasing the current could damage the gate. Thus, to increase the charge current, the circuit scale of the pre-driver would have to be enlarged.

BRIEF DESCRIPTION OF THE DRAWINGS

The invention, together with objects and advantages thereof, may best be understood by reference to the following description of the presently preferred embodiments together with the accompanying drawings in which:

FIG. 2A is a waveform diagram showing the output voltage of the half-bridge circuit and internal power supply voltage of the pre-driver; and FIG. 2B is a waveform diagram showing differences between the internal power supply voltage of the pre-driver and output voltage of the half-bridge circuit.

DETAILED DESCRIPTION OF THE PREFERRED EMBODIMENTS

Figure 1:
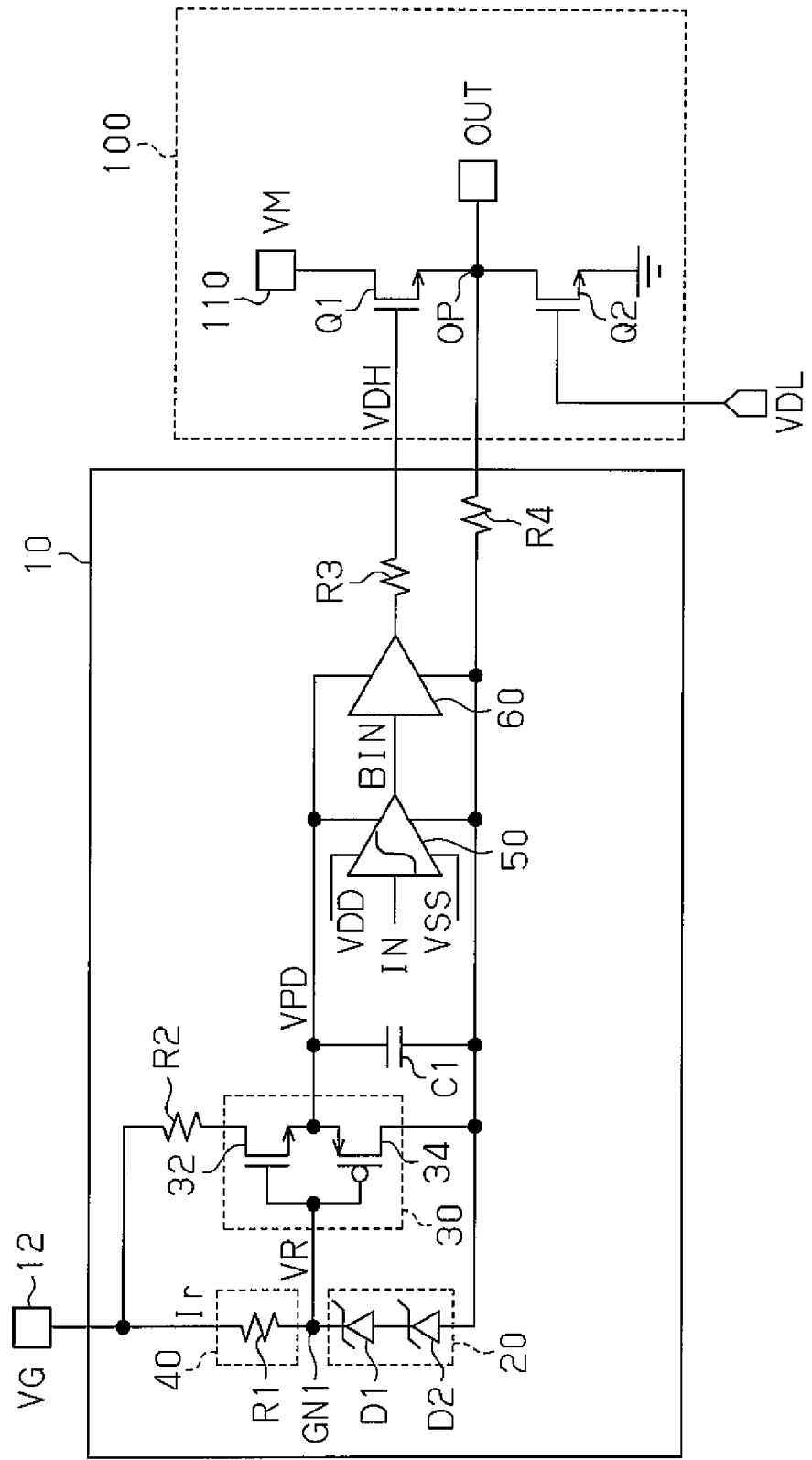
FIG. 1 is a schematic circuit diagram showing a preferred embodiment of a pre-driver according to the present invention for driving a high-side transistor in a half-bridge circuit.

In the drawings, like numerals are used for like elements throughout.

The present invention provides a pre-driver for generating drive voltage for driving a high-side transistor of a bridge driver that does not exceed the device withstand voltage of the high-side transistor.

One aspect of the present invention is a pre-driver for connection to a bridge driver that generates a bridge driver output voltage at an output node between a first drive transistor connected to a first high-voltage power supply and a second drive transistor connected between the first drive transistor and ground. The pre-driver includes a reference circuit for generating reference voltage that is varied in a manner dependent on the output voltage of the bridge driver. A regulator circuit generates, in response to the reference voltage, internal power supply voltage that is substantially higher than the output voltage by a constant voltage. A buffer circuit generates drive voltage that drives the first drive transistor based on the internal power supply voltage and the output voltage.

A further aspect of the present invention is a pre-driver for connection to a bridge driver that generates a bridge driver output voltage at an output node between a first drive transistor connected to a first high-voltage power supply and a second drive transistor connected between the first drive transistor and ground. The pre-driver includes a reference circuit, connected between the output node and a second high-voltage power supply that supplies higher voltage than the first high-voltage power supply, for generating reference voltage that is varied in a manner dependent on the output voltage of the bridge driver. A push-pull circuit, connected between the output node and the second high-voltage power supply and including an output terminal and an input terminal that receives the reference voltage, generates internal power supply voltage that is substantially higher than the output voltage by a constant voltage in response to the reference voltage. A current adjustment circuit, connected between the second high-voltage power supply and the input terminal of the push-pull circuit, adjusts current that flows to the input terminal of the push-pull circuit. A buffer circuit generates drive voltage that drives the first drive transistor based on the internal power supply voltage and the output voltage.

Other aspects and advantages of the present invention will become apparent from the following description, taken in conjunction with the accompanying drawings, illustrating by way of example the principles of the invention.

A preferred embodiment of a pre-driver 10 according to a preferred embodiment of the present invention will now be discussed with reference to FIGS. 1, 2A and 2B. FIG. 1 is a schematic circuit diagram of the pre-driver 10 connected to a half-bridge circuit 100, which is one type of a bridge driver.

Referring to FIG. 1, the half-bridge circuit 100 includes a high-side transistor Q1 (first drive transistor) and a low-side transistor Q2 (second drive transistor), which are connected in series between a first high-voltage power supply 110 and ground. In the preferred embodiment, the transistors Q1 and Q2 are formed by N-channel MOS transistors. More particularly, the transistor Q1 has a drain connected to the first high voltage power supply 110, a source connected to an output terminal OP of the half-bridge circuit 100, and a gate for receiving first drive voltage VDH. The transistor Q2 has a source connected to ground, a drain connected to the output terminal OP, and a gate for receiving second drive voltage VDL. A load (e.g., motor) is connected to the output terminal OP. The transistors Q1 and Q2 are operated in a complementary manner by the drive voltages VDH and VDL. As a result, output voltage OUT having the level of the first high-voltage power supply 110 or the ground level is supplied to the load from an output node (the output terminal OP) between the two transistors Q1 and Q2.

The pre-driver 10, which is connected to the half-bridge circuit 100, generates the first drive voltage VDH to drive the high-side transistor Q1. The second drive voltage VDL, which drives the low-side transistor Q2, is generated by another pre-driver (not shown). The pre-driver 10 may, of course, include a circuit that generates the second drive voltage VDL.

As shown in FIG. 1, the pre-driver 10 is connected to a second high-voltage power supply 12. The second high-voltage power supply 12 provides the pre-driver 10 with second power supply voltage VG, which is higher than first power supply voltage VM supplied to the half-bridge circuit 100 by the first high-voltage power supply 110. The second power supply voltage VG is set to a value corresponding to, for example, "first power supply voltage VM+Vgst". Here, Vgst represents the source-gate withstand voltage (hereafter referred to as the "gate withstand voltage") of the high-side transistor Q1 in the half-bridge circuit 100. That is, the second power supply voltage VG is set based on the gate withstand voltage Vgst of the transistor Q1 and the first power supply voltage VM so that the pre-driver 10 can drive the transistor Q1 even if the output voltage OUT rises to the first power supply voltage VM. The second power supply voltage VG is generated by, for example, an external charge pump (not shown).

The pre-driver 10 includes a reference circuit 20, a regulator circuit 30, a level shifter 50, and a buffer circuit 60. Preferably, the pre-driver 10 further includes a current adjustment circuit 40, as shown in FIG. 1. The reference circuit 20 is connected between the second high-voltage power supply 12 and the output terminal OP of the half-bridge circuit 100. The reference circuit 20 includes at least one Zener diode. For example, the reference circuit 20 of the preferred embodiment includes two series-connected Zener diodes D1 and D2.

The anode of the Zener diode D2 is connected to the output terminal OP of the half-bridge circuit 100 via a resistor R4. The cathode of the Zener diode D2 is connected to the anode of the Zener diode D1. The cathode of the Zener diode D1 is connected to the second high voltage power supply 12 via the current adjustment circuit 40. That is, the current adjustment circuit 40 is arranged between the second high-voltage power supply 12 and the reference circuit 20.

The reference circuit 20 clamps the second power supply voltage VG supplied from the second high-voltage power supply 12 and generates reference voltage VR, which is higher than the output voltage OUT by an amount corresponding to the breakdown voltage of the Zener diodes D1 and D2. That is, when the breakdown voltage of each of the Zener diodes D1 and D2 is represented by "VB", the reference circuit 20 of the preferred embodiment generates a reference voltage VR of "OUT+2VB". Accordingly, the reference voltage VR varies in a manner dependent on the output voltage OUT of the half-bridge circuit 100.

The regulator circuit 30 is connected between the second high-voltage power supply 12 and the output terminal OP. The regulator circuit 30 includes an input terminal, which is connected to a node GN1 (gate node) between the reference circuit 20 and the current adjustment circuit 40, and an output terminal.

In the preferred embodiment, the regulator circuit 30 includes a push-pull circuit formed by two transistors 32 and 34. The transistor 32 is formed by an NMOS transistor, and the transistor 34 is formed by a PMOS transistor. That is, the push-pull circuit has a CMOS push-pull configuration. The transistor 32 has a gate connected to the input terminal of the regulator circuit 30, a source connected to the output terminal of the regulator circuit 30, and a drain connected to the second high-voltage power supply 12 via a resistor R2. The transistor 34 has a gate connected to the input terminal of the regulator circuit 30, a source connected to the output terminal of the regulator circuit 30, and a drain connected to the anode of the Zener diode D2. Accordingly, the gates of the two transistors 32 and 34 are both supplied with reference voltage VR via the gate node GN1.

In response to the reference voltage VR, the push-pull circuit generates internal power supply voltage VPD, which is substantially higher than the output voltage OUT by a constant voltage. As mentioned above, the reference voltage VR varies in a manner dependent on the output voltage OUT and has a voltage level that is higher than the output voltage OUT. Thus, when an increase in the output voltage OUT increases the reference voltage VR, the transistor 32 is activated and the transistor 34 is deactivated. On the other hand, when a decrease in the output voltage OUT decreases the reference voltage VR, the transistor 32 is deactivated and the transistor 34 is activated. Accordingly, the transistors 32 and 34 operate in a complementary manner in accordance with the output voltage OUT, or the reference voltage VR.

When the transistor 32 is activated, if the threshold value of the transistor 32 is represented by "Vt", the internal power supply voltage VPD of "VR−Vt" is output from a node between the transistors 32 and 34, or the output terminal of the regulator circuit 30. When the transistor 34 is activated, if the threshold value (absolute value) of the transistor 32 is also represented by "Vt", internal power supply voltage VPD of "VR+Vt" is output from the output terminal of the regulator circuit 30. As described above, the reference voltage VR is "VR=OUT+2VB". Accordingly, the internal power supply voltage VPD varies within the range defined by the next expression.

$$\text{OUT}+(2VB-Vt) \leq VPD \leq \text{OUT}+(2VB+Vt) \quad \text{Expression 1}$$

As shown by expression 1, the push-pull circuit generates the internal power supply voltage VPD of OUT+(2VB±Vt) in response to the reference voltage VR. In the preferred embodiment, the reference voltage VR is set by the breakdown voltage 2VB of the Zener diodes D1 and D2 so that the maximum voltage "2VB+Vt", which is added to the output voltage OUT by the push-pull circuit, does not exceed the gate voltage Vgst of the high-side transistor Q1. Here, Vt is smaller than 2VB. Accordingly, the internal power supply voltage VPD is substantially higher than the output voltage OUT by a constant voltage (gate withstand voltage Vgst).

The current adjustment circuit 40 includes the resistor R1. The resistor R1 has one end connected to the second high-voltage power supply 12 and another end connected to the gate node GN1, that is, the input terminal of the push-pull circuit. The resistance value of the resistor R1 determines the current Ir flowing from the second high-voltage power supply 12 to the gate node GN1. Accordingly, adjustment of the resistance value of the resistor R1 changes the speed for charging a gate capacitor (coupling capacitor) of the transistors 32 and 34. The resistance value of the resistor R1 is increased to restrict the current Ir. This restricts the response speed of the push-pull circuit but reduces switching noise in the transistors 32 and 34. Thus, the push-pull circuit generates internal power supply voltage VPD in a further stable manner. Further, the resistance value of the resistor R1 is decreased to increase the current Ir flowing to the gate node GN1. This improves the response speed of the push-pull circuit. However, more switching noise may be produced. Accordingly, the resistance value of the resistor R1 is set so as to trade off the response speed of the push-pull circuit with switching noise.

A capacitor C1 is connected between the output terminal of the regulator circuit 30 (push-pull circuit) and the anode of the Zener diode D2. The capacitor C1 stabilizes the internal power supply voltage VPD.

The level shifter 50 converts an input signal IN, which has a first amplitude level and oscillates between the voltage VDD and voltage VSS, to an output signal BIN, which has a second amplitude level and oscillates between the internal power supply voltage VPD and output voltage OUT. The input signal IN controls the activation and deactivation of the high-side transistor Q1.

The buffer circuit 60 is connected between the gate of the high-side transistor Q1 and the level shifter 50. Preferably, the buffer circuit 60 is connected to the gate of the transistor Q1 via a resistor R3. Referring to FIG. 1, the buffer circuit 60 buffers the output signal BIN of the level shifter 50 based on the internal power supply voltage VPD and the output voltage OUT to stably generate the first drive voltage VDH. The first drive voltage VDH is supplied to the gate of the transistor Q1.

FIG. 2A is a waveform diagram showing the output voltage of the half-bridge circuit 100 (simulation values) and internal power supply voltage VPD (simulation values) of the pre-driver 10. As shown in FIG. 2A, the output voltage varies in a manner dependent on the output voltage OUT. Further, as shown in FIG. 2B, the internal power supply voltage VPD has a level that is substantially higher than the output voltage by an amount corresponding to a constant voltage (corresponding to gate withstand voltage Vgst).

The pre-driver 10 of the preferred embodiment has the advantages described below.

In accordance with the output voltage OUT of the half-bridge circuit 100, the push-pull circuit (30) generates the internal power supply voltage VPD that is substantially higher than the output voltage OUT by the gate withstand voltage Vgst. The buffer circuit 60 generates the first drive voltage VDH based on the internal power supply voltage VPD, which is generated by the push-pull circuit, and the output voltage OUT. This prevents the transistor Q1 from being supplied with voltage exceeding the gate withstand voltage Vgst.

The pre-driver 10 uses the buffer circuit 60 to generate the first drive voltage VDH. This increases the responsiveness of the pre-driver 10 from that of a prior art pre-driver, which generates the drive voltage of the high-side transistor through constant current control.

The response speed of the push-pull circuit (30) may be changed by the current adjustment circuit 40 (resistor R1). In such a case, the resistance value of the resistor R1 is lowered to increase the response speed. Thus, the circuit scale of the pre-driver is not enlarged. Further, even when increasing the response speed, the internal power supply voltage VPD does not become greater than or equal to "output voltage OUT+ gate withstand voltage Vgst". This ensures prevention of gate damaging.

It should be apparent to those skilled in the art that the present invention may be embodied in many other specific forms without departing from the spirit or scope of the invention. Particularly, it should be understood that the present invention may be embodied in the following forms.

The capacitor C1 may be eliminated.

The resistor R2 may be eliminated.

The reference circuit 20 may be formed by a single Zener diode. Alternatively, the reference circuit 20 may be formed by three or more Zener diodes.

The size of the buffer circuit 60 (transistor size) and the size of the resistor R3 (resistance value) may be varied to change the response speed of the pre-driver 10.

The bridge driver is not limited to the half-bridge circuit 100. The pre-driver 10 of the above embodiment may be used to drive the high-side transistor of a full-bridge circuit.

A diode-connected transistor may be used in lieu of Zener diodes in the reference circuit 20. In this case, the reference circuit 20 includes at least one diode-connected transistor.

The present examples and embodiments are to be considered as illustrative and not restrictive, and the invention is not to be limited to the details given herein, but may be modified within the scope and equivalence of the appended claims.

What is claimed is:

1. A pre-driver for connection to a bridge driver that generates a bridge driver output voltage at an output node between a first drive transistor connected to a first high-voltage power supply and a second drive transistor connected between the first drive transistor and ground, the pre-driver comprising:
   a reference circuit, connected between the output node and a second high-voltage power supply, for generating a reference voltage that varies depending on the bridge driver output voltage;
   a regulator circuit, connected to the reference circuit and receiving the reference voltage therefrom, for generating, in response to the reference voltage, an internal power supply voltage that is substantially higher than the bridge driver output voltage by a constant voltage; and
   a buffer circuit, connected between the regulator circuit and the output node, and to the first drive transistor, for generating a drive voltage that drives the first drive transistor based on the internal power supply voltage and the bridge driver output voltage.

2. The pre-driver of claim 1, wherein the reference voltage generated by the reference circuit is higher than the output voltage by a predetermined voltage.

3. The pre-driver of claim 1, wherein the first drive transistor is a MOS transistor having a drain connected to the first high-voltage power supply, a source connected to the output node, and a gate receiving the drive voltage, and the constant voltage is set to a source-gate withstand voltage of the MOS transistor.

4. The pre-driver of claim 1, further comprising:
   a current adjustment circuit, connected to the reference circuit and the regulator circuit, for adjusting current that flows to the regulator circuit.

5. The pre-driver of claim 4, wherein the current adjustment circuit includes a resistor.

6. The pre-driver of claim 1, further comprising:
   a level shifter, connected to the buffer circuit, for converting an input signal, which has a first amplitude level, to an output signal, which has a second amplitude level and oscillates between the internal power supply voltage and the output voltage.

7. The pre-driver of claim 1, wherein the reference circuit includes at least one Zener diode.

8. The pre-driver of claim 7, wherein the at least one Zener diode includes a plurality of series-connected Zener diodes.

9. The pre-driver of claim 1, wherein the regulator circuit includes a push-pull circuit, connected between the output node and a second high-voltage power supply that supplies higher voltage than the first high-voltage power supply, for generating the internal power supply voltage in response to the reference voltage.

10. The pre-driver of claim 9, wherein:
the reference circuit is connected between the second high-voltage power supply and the output node and generates the reference voltage at a gate node between the second high-voltage power supply and the reference circuit;
the push-pull circuit includes:
  an NMOS transistor having a drain connected to the second high-voltage power supply, a gate connected to the gate node, and a source; and
  a PMOS transistor having a source connected to the source of the NMOS transistor, a drain connected to the output node, and a gate connected to the gate node; and
the push-pull circuit generates the internal power supply voltage at the sources of the NMOS transistor and the PMOS transistor.

11. The pre-driver of claim 10, wherein the reference circuit includes at least one Zener diode connected between the gate node and the output node.

12. The pre-driver of claim 11, wherein the at least one Zener diode includes a plurality of series-connected Zener diodes.

13. The pre-driver of claim 10, further comprising:
a current adjustment circuit, connected between the second high-voltage power supply and the gate node, for adjusting current that flows to the gate node.

14. The pre-driver of claim 1, further comprising:
a capacitor including a first terminal to which the internal power supply voltage is applied and a second terminal to which the output voltage of the bridge driver is applied.

15. The pre-driver of claim 1, wherein the bridge driver is one of a half-bridge circuit and a full-bridge circuit.

16. A pre-driver for connection to a bridge driver that generates a bridge driver output voltage at an output node between a first drive transistor connected to a first high-voltage power supply and a second drive transistor connected between the first drive transistor and ground, the pre-driver comprising:
  a reference circuit, connected between the output node and a second high-voltage power supply that supplies higher voltage than the first high-voltage power supply, for generating a reference voltage that varies depending on the output voltage of the bridge driver;
  a push-pull circuit, connected between the output node and the second high-voltage power supply and including an output terminal and an input terminal that receives the reference voltage, for generating an internal power supply voltage that is substantially higher than the output voltage by a constant voltage in response to the reference voltage;
  a current adjustment circuit, connected between the second high-voltage power supply and the input terminal of the push-pull circuit, for adjusting current that flows to the input terminal of the push-pull circuit; and
  a buffer circuit, connected between the push-pull circuit and the output node, and to the first drive transistor, for generating a drive voltage that drives the first drive transistor based on the internal power supply voltage and the output voltage.

* * * * *